(12) United States Patent
Sasaki et al.

(10) Patent No.: US 11,081,598 B2
(45) Date of Patent: Aug. 3, 2021

(54) TRENCH MOS SCHOTTKY DIODE

(71) Applicants: TAMURA CORPORATION, Tokyo (JP); NOVEL CRYSTAL TECHNOLOGY, INC., Saitama (JP)

(72) Inventors: Kohei Sasaki, Sayama (JP); Masataka Higashiwaki, Tokyo (JP)

(73) Assignees: TAMURA CORPORATION, Tokyo (JP); NOVEL CRYSTAL TECHNOLOGY, INC., Saitama (JP)

( * ) Notice: Subject to any disclaimer, the term of this patent is extended or adjusted under 35 U.S.C. 154(b) by 28 days.

(21) Appl. No.: 16/489,213

(22) PCT Filed: Feb. 27, 2018

(86) PCT No.: PCT/JP2018/007274
§ 371 (c)(1),
(2) Date: Aug. 27, 2019

(87) PCT Pub. No.: WO2018/155711
PCT Pub. Date: Aug. 30, 2018

(65) Prior Publication Data
US 2020/0066921 A1     Feb. 27, 2020

(30) Foreign Application Priority Data
Feb. 27, 2017 (JP) .............. JP2017-034835

(51) Int. Cl.
*H01L 29/872* (2006.01)
*H01L 29/40* (2006.01)
(Continued)

(52) U.S. Cl.
CPC ........ *H01L 29/8725* (2013.01); *H01L 29/407* (2013.01); *H01L 29/4236* (2013.01); *H01L 29/7813* (2013.01); *H01L 29/872* (2013.01)

(58) Field of Classification Search
CPC ............... H01L 29/8725; H01L 29/407; H01L 29/4236; H01L 29/0649; H01L 29/24; H01L 29/36; H01L 29/7813; H01L 29/872
See application file for complete search history.

(56) References Cited

U.S. PATENT DOCUMENTS 5,365,102 A    11/1994   Mehrotra et al.
7,615,849 B2   11/2009   Nakamura et al.
                         (Continued)

FOREIGN PATENT DOCUMENTS

CN   104051548 A    9/2014
EP   2 779 242 A1   9/2014
                    (Continued)

OTHER PUBLICATIONS

International Search Report dated Apr. 3, 2018 issued in PCT/JP2018/007274.
(Continued)

*Primary Examiner* — Patricia D Reddington
(74) *Attorney, Agent, or Firm* — Scully, Scott, Murphy & Presser, P.C.

(57) ABSTRACT

A trench MOS Schottky diode includes a first semiconductor layer including a $Ga_2O_3$-based single crystal, a second semiconductor layer that is a layer laminated on the first semiconductor layer and that includes a $Ga_2O_3$-based single crystal and a trench opened on a surface thereof opposite to the first semiconductor layer, an anode electrode formed on the surface of the second semiconductor layer, a cathode electrode formed on a surface of the first semiconductor layer, an insulating film covering an inner surface of the trench, and a trench MOS gate that is buried in the trench so as to be covered with the insulating film and is in contact with the anode electrode. The second semiconductor layer includes a lower layer on a side of the first semiconductor
(Continued)

layer and an upper layer on a side of the anode electrode having a higher donor concentration than the lower layer.

12 Claims, 6 Drawing Sheets

(51) Int. Cl.
*H01L 29/423* (2006.01)
*H01L 29/78* (2006.01)

(56) References Cited

U.S. PATENT DOCUMENTS

| | | | |
|---|---|---|---|
| 10,290,707 B2 | 5/2019 | Mimura et al. | |
| 2007/0057262 A1 | 3/2007 | Nakamura et al. | |
| 2014/0217405 A1* | 8/2014 | Sasaki | H01L 29/66712 |
| | | | 257/43 |
| 2015/0325660 A1 | 11/2015 | Hitora et al. | |
| 2017/0200790 A1 | 7/2017 | Hitora et al. | |
| 2018/0097061 A1 | 4/2018 | Mimura et al. | |

FOREIGN PATENT DOCUMENTS

| | | |
|---|---|---|
| JP | H08-512430 A | 12/1996 |
| JP | 2007-080971 A | 3/2007 |
| JP | 2008-140968 A | 6/2008 |
| JP | 2013-102081 A | 5/2013 |
| JP | 2015-227279 A | 12/2015 |
| JP | 2016-181617 A | 10/2016 |
| WO | WO 2016/013554 A1 | 1/2016 |

OTHER PUBLICATIONS

Shimizu, T et al., 100V Trench MOS Barrier Schottky Rectifier Using Thick Oxide Layer (TO-TMBS), Proceedings of 2001 International Symposium on Power Semiconductor Devices & ICs, Osaka, pp. 243-246.

Khemka, V. et al., "A Fully Planarized 4H-SiC Trench MOS Barrier Schottky (TMBS) Rectifier", IEEE Electron Device Letters (May 2000), vol. 21, No. 5, pp. 286-288.

Notice of Reasons for Refusal dated Dec. 8, 2020 received from the Japanese Patent Office in related application JP 2017-034835 together with English translation.

International Preliminary Report on Patentability together with the Written Opinion from related International Application No. PCT/JP2018/007274 dated Sep. 6, 2019.

Extended European Search Report dated Nov. 3, 2020 from related application EP 18757087.4.

Mehrotra, M. et al: "Trench MOS barrier Schottky (TMBS) rectifier: a Schottky rectifier with higher than parallel plane breakdown voltage", Solid State Electronics, Elsevier Science Publishers, Barking, GB, vol. 38, No. 4, Apr. 1, 1995 (Apr. 1, 1995), pp. 801-806, XP004024828.

Japanese Decision on Final Rejection dated May 25, 2021 received in Japanese Patent Application No. 2017-034835, together with an English-language translation.

* cited by examiner

TRENCH MOS SCHOTTKY DIODE

TECHNICAL FIELD

The invention relates to a trench MOS Schottky diode.

BACKGROUND ART

A Schottky barrier diode (Schottky diode) using $Ga_2O_3$ as a semiconductor layer is known (e.g., JP 2013/102081 A).

JP 2013/102081 A states that the Schottky diode has, e.g., a breakdown voltage of 1000V when an n-$Ga_2O_3$ layer has an electron carrier concentration of $9.95 \times 10^{16}$ cm$^{-3}$ and a thickness of 3.3 μm.

A trench MOS Schottky diode using Si as a semiconductor layer and a trench MOS Schottky diode using SiC as a semiconductor layer are also known (e.g., Non-Patent Literatures 1 and 2).

Non-Patent Literature 1 states that the trench MOS Schottky diode using Si as a semiconductor layer has a breakdown voltage of 107V when an n-Si layer has a doping concentration of $1 \times 10^{16}$ cm$^{-3}$ and a thickness of 9 μm.

From the reverse voltage/reverse current characteristics stated in Non-Patent Literature 2, the trench MOS Schottky diode using SiC as a semiconductor layer appears to have a breakdown voltage of about several tens of volts when an n-SiC layer has a doping concentration of $6 \times 10^{15}$ cm$^{-3}$ and a thickness of 4 μm.

CITATION LIST

Patent Literature

JP 2013/102081 A

Non-Patent Literatures

Non-Patent Literature 1: T. Shimizu et al., Proceedings of 2001 International Symposium on Power Semiconductor Devices & ICs, Osaka, pp. 243-246 (2001)

Non-Patent Literature 2: V. Khemka, et al., IEEE ELECTRON DEVICE LETTERS, VOL. 21, NO. 5, May 2000, pp. 286-288

SUMMARY OF INVENTION

Technical Problem

In JP 2013/102081 A, a breakdown voltage of the Schottky diode is defined by a breakdown field strength of $Ga_2O_3$. However, when a reverse voltage is increased in a Schottky diode using a material with a high breakdown field strength such as $Ga_2O_3$, a leakage current between an anode electrode and a $Ga_2O_3$ layer increases drastically before breakdown of the $Ga_2O_3$ layer occurs, and the Schottky diode burns out.

Thus, it is appropriate that a reverse voltage when a leakage current of a predetermined magnitude (e.g., 1 μA) flows is defined as a breakdown voltage for a Schottky diode using $Ga_2O_3$ as a semiconductor layer. The Schottky diode disclosed in JP 2013/102081 A does not have a special structure to reduce a leakage current and a roughly estimated reverse voltage at a leakage current of 1 μA is about 64V when the n-$Ga_2O_3$ layer has a carrier concentration of $9.95 \times 10^{16}$ cm$^{-3}$.

It is an object of the invention to provide a trench MOS Schottky diode having a high breakdown voltage and a low loss.

Solution to Problem

To achieve the above-mentioned object, an aspect of the invention provides a trench MOS Schottky diode defined by [1] to [6] below.

[1] 1. A trench MOS Schottky diode, comprising: a first semiconductor layer comprising a $Ga_2O_3$-based single crystal; a second semiconductor layer that is a layer laminated on the first semiconductor layer and that comprises a $Ga_2O_3$-based single crystal and a trench opened on a surface thereof opposite to the first semiconductor layer; an anode electrode formed on the surface of the second semiconductor layer opposite to the first semiconductor layer; a cathode electrode formed on a surface of the first semiconductor layer opposite to the second semiconductor layer; an insulating film covering an inner surface of the trench of the second semiconductor layer; and a trench MOS gate that is buried in the trench of the second semiconductor layer so as to be covered with the insulating film and is in contact with the anode electrode, wherein the second semiconductor layer comprises a lower layer on a side of the first semiconductor layer and an upper layer on a side of the anode electrode having a higher donor concentration than the lower layer.

[2] The trench MOS Schottky diode according to [1], wherein a height of an interface between the upper layer and the lower layer is not less than a height of a bottom of the trench.

[3] The trench MOS Schottky diode according to [2], wherein the height of the interface between the upper layer and the lower layer is not less than a height of a lowest part of the trench MOS gate.

[4] The trench MOS Schottky diode according to any one of [1] to [3], wherein a donor concentration of the first semiconductor layer is higher than a donor concentration of the upper layer of the second semiconductor layer.

[5] The trench MOS Schottky diode according to any one of [1] to [3], comprising a plurality of the trenches, wherein each mesa-shaped portion of the second semiconductor layer between adjacent trenches has a width according to the donor concentration of the upper layer of the second semiconductor layer.

[6] The trench MOS Schottky diode according to any one of [1] to [3], wherein a lower surface of the insulating film is covered with an insulation having a lower permittivity than the insulating film.

Advantageous Effects of Invention

According to the invention, it is possible to provide a trench MOS Schottky diode having a high breakdown voltage and a low loss.

DESCRIPTION OF EMBODIMENTS

First Embodiment (Configuration of the Trench MOS Schottky Diode)

Figure 1:
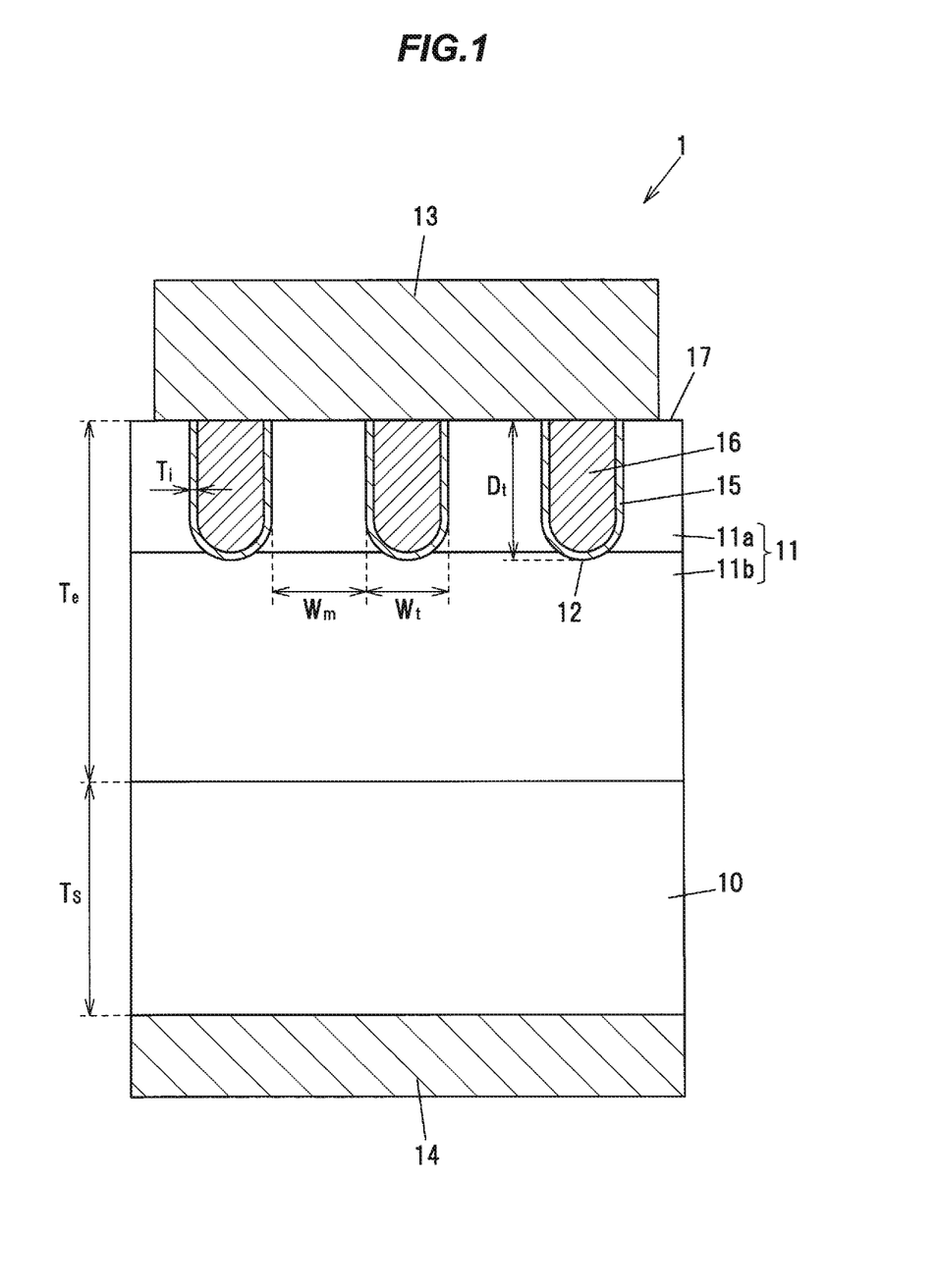
FIG. 1 is a vertical cross-sectional view showing a trench MOS Schottky diode in the first embodiment.

FIG. 1 is a vertical cross-sectional view showing a trench MOS Schottky diode 1 in the first embodiment. The trench MOS Schottky diode 1 is a vertical Schottky diode having a trench MOS region.

The trench MOS Schottky diode 1 has a first semiconductor layer 10, a second semiconductor layer 11 which is a layer laminated on the first semiconductor layer 10 and has trenches 12 opened on a surface 17 thereof opposite to the first semiconductor layer 10, an anode electrode 13 formed on the surface 17 of the second semiconductor layer 11, a cathode electrode 14 formed on a surface of the first semiconductor layer 10 opposite to the second semiconductor layer 11, insulating films 15 covering inner surfaces of the trenches 12 of the second semiconductor layer 11, and trench MOS gates 16 which are buried in the trenches 12 of the second semiconductor layer 11 so as to be covered with the insulating films 15 and are in contact with the anode electrode 13.

In the trench MOS Schottky diode 1, an energy barrier at an interface between the anode electrode 13 and the second semiconductor layer 11 as viewed from the second semiconductor layer 11 is lowered by applying forward voltage between the anode electrode 13 and the cathode electrode 14 (positive potential on the anode electrode 13 side), allowing an electric current to flow from the anode electrode 13 to the cathode electrode 14.

On the other hand, when reverse voltage is applied between the anode electrode 13 and the cathode electrode 14 (negative potential on the anode electrode 13 side), the electric current does not flow due to the Schottky barrier. When reverse voltage is applied between the anode electrode 13 and the cathode electrode 14, a depletion layer spreads from an interface between the anode electrode 13 and the second semiconductor layer 11 and from an interface between the insulating films 15 and the second semiconductor layer 11.

In general, the upper limit of reverse leakage current in Schottky diode is 1 µA. In the embodiments, reverse voltage when a leakage current of 1 µA flows is defined as breakdown voltage.

According to data of dependence of reverse leakage current on electric field strength at Schottky interface in Schottky diode having a SiC semiconductor layer described in, e.g., "Technology of Semiconductor SiC and its Application" by Hiroyuki Matsunami, Noboru Otani, Tsunenobu Kimoto und Takashi Nakamura, Second Edition, Nikkan Kogyo Shimbun, Ltd., Sep. 30, 2011, p. 355, electric field strength immediately under Schottky electrode is about 0.8 MV/cm when a current density of reverse leakage current is 0.0001 A/cm$^2$. 0.0001 A/cm$^2$ here is a current density immediately under the Schottky electrode when an electric current of 1 µA flows through the Schottky electrode having a size of 1 mm×1 mm.

Thus, even when breakdown field strength of the semiconductor material itself is several MV/cm, a leakage current of more than 1 µA flows when the electric field strength immediately under the Schottky electrode exceeds 0.8 MV/cm.

In order to obtain breakdown voltage of 1200V in, e.g., a conventional Schottky diode not having a special structure to reduce electric field strength immediately under Schottky electrode, a donor concentration in a semiconductor layer needs to be reduced to the order of $10^{15}$ cm$^{-3}$ and also the semiconductor layer needs to be very thick so that the electric field strength immediately under the Schottky electrode is kept not more than 0.8 MV/cm. This causes a significant increase in conduction loss, and it is thus difficult to make a Schottky barrier diode having a high breakdown voltage and a low loss.

The trench MOS Schottky diode 1 in the first embodiment has a trench MOS structure and thus can have a high breakdown voltage without an increase in resistance of the semiconductor layer. In other words, the trench MOS Schottky diode 1 is a Schottky diode having a high breakdown voltage and a low loss.

Junction barrier Schottky (JBS) diode is known as a Schottky diode having a high breakdown voltage and a low loss. However, Ga$_2$O$_3$ is not suitable as a material for the JBS diode requiring a p-type region since it is difficult to manufacture p-type Ga$_2$O$_3$.

The first semiconductor layer 10 is formed of an n-type Ga$_2$O$_3$-based single crystal containing a Group IV element, such as Si or Sn, as a donor. A donor concentration of the first semiconductor layer 10 is, e.g., not less than $1.0 \times 10^{18}$ and not more than $1.0 \times 10^{20}$ cm$^{-3}$. A thickness $T_s$ of the first semiconductor layer 10 is, e.g., 10 to 600 µm. The first semiconductor layer 10 is, e.g., a Ga$_2$O$_3$-based single crystal substrate.

The Ga$_2$O$_3$-based single crystal here means a Ga$_2$O$_3$ single crystal or is a Ga$_2$O$_3$ single crystal doped with an element such as Al or In, and may be, e.g., a (Ga$_x$Al$_y$In$_{(1-x-y)}$)$_2$O$_3$ (0<x≤1, 0≤y<1, 0<x+y≤1) single crystal which is a Ga$_2$O$_3$ single crystal doped with Al and In. The band gap is widened by adding Al and is narrowed by adding In. The Ga$_2$O$_3$ single crystal mentioned above has, e.g., a β-crystal structure.

The second semiconductor layer 11 is formed of an n-type Ga$_2$O$_3$-based single crystal containing a Group IV element, such as Si or Sn, as a donor. The second semiconductor layer 11 is, e.g., an epitaxial layer epitaxially grown on the first semiconductor layer 10 which is a Ga$_2$O$_3$-based single crystal substrate.

A high-donor-concentration layer containing a high concentration of donor may be additionally formed between the first semiconductor layer 10 and the second semiconductor layer 11. The high-donor-concentration layer is used when, e.g., the second semiconductor layer 11 is epitaxially grown on the first semiconductor layer 10 as a substrate. At the early growth stage of the second semiconductor layer 11, the amount of dopant incorporated thereinto is unstable and an acceptor impurity is diffused from the first semiconductor layer 10 as a substrate. Thus, in some cases, resistance increases in a region of the second semiconductor layer 11 close to the interface with the first semiconductor layer 10 when the second semiconductor layer 11 is grown directly on the first semiconductor layer 10. The high-donor-concentration layer is used to avoid such problems. The concentration in the high-donor-concentration layer is set to be, e.g., higher than the concentration in the second semiconductor layer 11, more preferably, higher than the concentration in the first semiconductor layer 10.

The second semiconductor layer 11 is composed of an upper layer 11a on the anode electrode 13 side and a lower layer 11b on the first semiconductor layer 10 side. The upper layer 11a has a higher donor concentration than the lower layer 11b. In addition, the donor concentrations of the upper layer 11a and the lower layer 11b are lower than the donor concentration of the first semiconductor layer 10.

As the donor concentration in the second semiconductor layer 11 increases, electrical field strength in each part of the trench MOS Schottky diode 1 increases, hence, large leakage current flows even when an applied reverse voltage is relatively small.

However, as a result of intense study, the present inventors discovered that the donor concentration in a layer with the trenches 12 in the second semiconductor layer 11, even when increased to a certain level, hardly affects the electric field strength in the second semiconductor layer 11 immediately under the anode electrode 13 (in the vicinity of the Schottky interface). On the other hand, by increasing the donor concentration in the layer with the trenches 12 in the second semiconductor layer 11, electrical resistance of the second semiconductor layer 11 is lowered and losses in the trench MOS Schottky diode 1 are thereby reduced.

This means that it is possible to reduce losses in the trench MOS Schottky diode 1 while keeping the electric field strength in the second semiconductor layer 11 immediately under the anode electrode 13 (in the vicinity of the Schottky interface) down to less than 0.8 MV/cm by dividing the second semiconductor layer 11 into the upper layer 11a and the lower layer 11b and adjusting the donor concentration in the upper layer 11a to be higher than the donor concentration in the lower layer 11b.

When the height of the interface between the upper layer 11a and the lower layer 11b is not less than the height of the bottom of the trench 12, an increase in the electric field strength in the vicinity of the Schottky interface caused by increasing the donor concentration in the upper layer 11a can be effectively suppressed. Furthermore, when the height of the interface between the upper layer 11a and the lower layer 11b is not less than the height of the lowest part of the trench MOS gate 16, an increase in the electric field strength in the vicinity of the Schottky interface can be suppressed more effectively.

The upper limit of the range of the donor concentration in the upper layer 11a of the second semiconductor layer 11, which hardly affects the breakdown voltage of the trench MOS Schottky diode 1, depends on a width $W_m$ of mesa-shaped portions of the second semiconductor layer 11 formed between adjacent trenches 12. Thus, it is preferable to set the width $W_m$ based on the donor concentration in the upper layer 11a of the second semiconductor layer 11.

The donor concentration in the lower layer 11b of the second semiconductor layer 11 is preferably not more than about $6.0 \times 10^{16}$ cm$^{-3}$ to lower the maximum electric field strength in a region of the second semiconductor layer 11 immediately under the anode electrode 13, the maximum electric field strength in the second semiconductor layer 11 and the maximum electric field strength in the insulating film 15. On the other hand, as the donor concentration in the lower layer 11b decreases, resistance of the second semiconductor layer 11 increases and the forward loss increases. Therefore, to obtain breakdown voltage of, e.g., not more than 1200V, the donor concentration is preferably not less than $3.0 \times 10^{16}$ cm$^{-3}$. To obtain higher breakdown voltage, the donor concentration is preferably reduced to, e.g., about $1.0 \times 10^{16}$ cm$^{-3}$.

As a thickness $T_e$ of the second semiconductor layer 11 increases, the maximum electric field strength in the second semiconductor layer 11 and the maximum electric field strength in the insulating film 15 decrease. By adjusting the thickness $T_e$ of the second semiconductor layer 11 to not less than about 6 μm, it is possible to effectively reduce the maximum electric field strength in the second semiconductor layer 11 and the maximum electric field strength in the insulating film 15. In view of reduction in these maximum electric field strengths and downsizing of the trench MOS Schottky diode 1, the thickness $T_e$ of the second semiconductor layer 11 is preferably about not less than 5.5 μm and not more than 9 μm.

Electrical field strength in each part of the trench MOS Schottky diode 1 changes depending on a depth $D_t$ of the trench 12. The depth $D_t$ of the trench 12 is preferably about not less than 2 μm and not more than 6 μm, more preferably, about not less than 3 μm and not more than 4 μm to lower the maximum electric field strength in a region of the second semiconductor layer 11 immediately under the anode electrode 13, the maximum electric field strength in the second semiconductor layer 11 and the maximum electric field strength in the insulating film 15. In the present specification, the width of the trench 12 is denoted as $W_t$.

Since the maximum electric field strength in the insulating film 15 decreases as permittivity of the insulating film 15 increases, the insulating film 15 is preferably formed of a high-permittivity material. For example, $Al_2O_3$ (relative permittivity of about 9.3) and $HfO_2$ (relative permittivity of about 22) can be used as a material of the insulating film 15, and it is particularly preferable to use $HfO_2$ which has high permittivity.

Meanwhile, as a thickness $T_i$ of the insulating film 15 increases, the maximum electric field strength in the second semiconductor layer 11 decreases but the maximum electric field strength in the insulating film 15 and the maximum electric field strength in a region immediately under the anode electrode 13 increase. In view of ease of manufacturing, the thickness of the insulating film 15 is preferably smaller, and is more preferably not more than 300 nm. It is, however, obvious that a certain thickness is required so that an electric current virtually does not flow directly between the trench MOS gate 16 and the second semiconductor layer 11.

The material of the trench MOS gate 16 is not specifically limited as long as it is electrically conductive, and it is possible to use, e.g., polycrystalline Si doped at a high concentration and a metal such as Ni or Au.

Electric field strength in the trench MOS Schottky diode 1 is affected by the width of the mesa-shaped portion between two adjacent trenches 12, the depth $D_t$ of the trench 12 and the thickness $T_i$ of the insulating film 15, etc., as described above, but is hardly affected by a planar pattern of the trenches 12. Thus, the planar pattern of the trenches 12 on the second semiconductor layer 11 is not specifically limited.

Figure 2A:
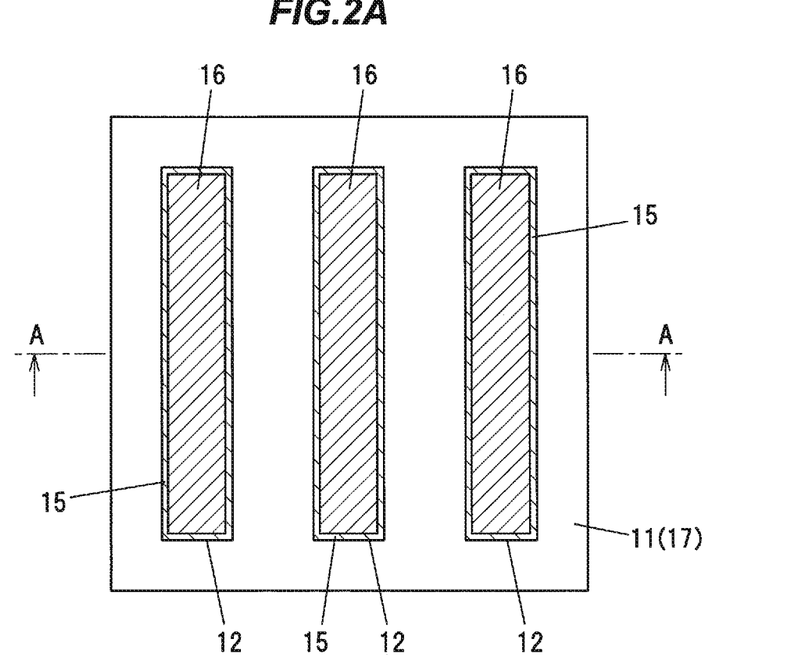
FIG. 2A is a top view showing a typical example of a planar trench pattern on a second semiconductor layer.
Figure 2B:
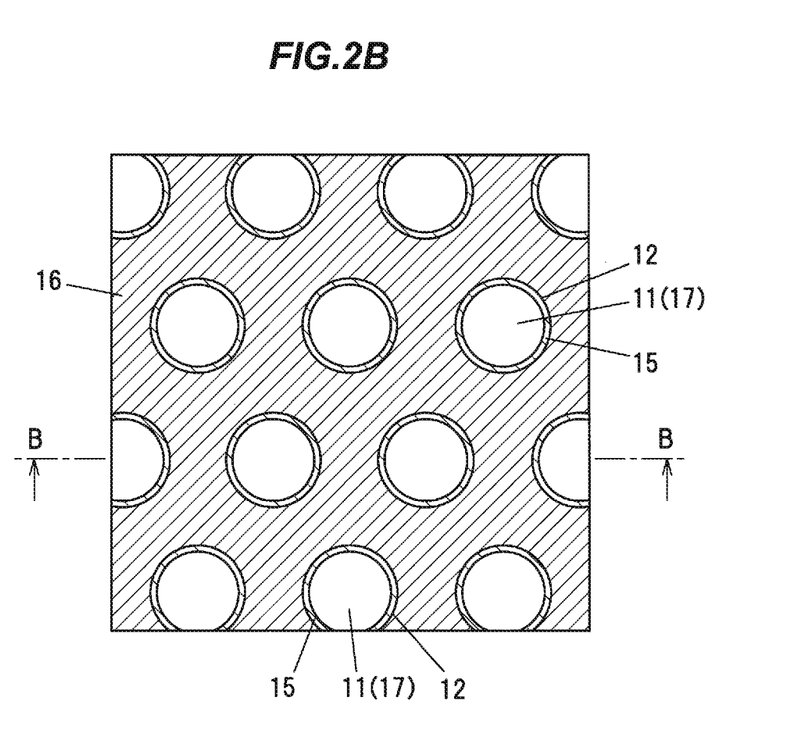
FIG. 2B is a top view showing another typical example of the planar trench pattern on the second semiconductor layer.

FIGS. 2A and 2B are top views respectively showing typical examples of the planar pattern of the trenches 12 on the surface 17 of the second semiconductor layer 11.

The trenches 12 shown in FIG. 2A are formed in a line-shaped planar pattern. The trenches 12 shown in FIG. 2B are formed in a planar pattern with dots each of which is the mesa-shaped portion between two adjacent trenches 12.

The cross section of the trench MOS Schottky diode 1 shown in FIG. 1 corresponds to a cross section cut along line A-A in case of the trench MOS Schottky diode 1 shown in FIG. 2A and a cross section cut along line B-B in case of the trench MOS Schottky diode 1 shown in FIG. 2B.

The anode electrode 13 is in Schottky contact with the second semiconductor layer 11. The anode electrode 13 is formed of Pt, Pd, Au, Ni, Ag, Cu, Al, Mo, In, Ti or polycrystalline Si, or oxide, nitride or alloy thereof, etc. A reverse leakage current at a Schottky interface between the anode electrode 13 and the second semiconductor layer 11 is smaller when a height of a barrier (barrier height) at the interface between the anode electrode 13 and the second semiconductor layer 11 is higher. Meanwhile, when a metal with a high barrier height is used to form the anode electrode 13, knee voltage (forward voltage) increases and the forward loss thus increases. Therefore, it is preferable to select a material having a barrier height with which the maximum reverse leakage current is about 1 µA. When reverse breakdown voltage is, e.g., 600V to 1200V, it is possible to maximize reduction of forward loss by adjusting the barrier height to about 0.7 eV while keeping the reverse leakage current down to about 1 µA. The anode electrode 13 may have a multilayer structure formed by laminating different metal films, e.g., Pt/Au, Pt/Al, Pd/Au, Pd/Al, Pt/Ti/Au or Pd/Ti/Au.

The cathode electrode 14 is in ohmic contact with the first semiconductor layer 10. The cathode electrode 14 is formed of a metal such as Ti. The cathode electrode 14 may have a multilayer structure formed by laminating different metal films, e.g., Ti/Au or Ti/Al. For reliable ohmic contact between the cathode electrode 14 and the first semiconductor layer 10, the cathode electrode 14 is preferably configured that a layer in contact with the first semiconductor layer 10 is formed of Ti.

Figure 3:
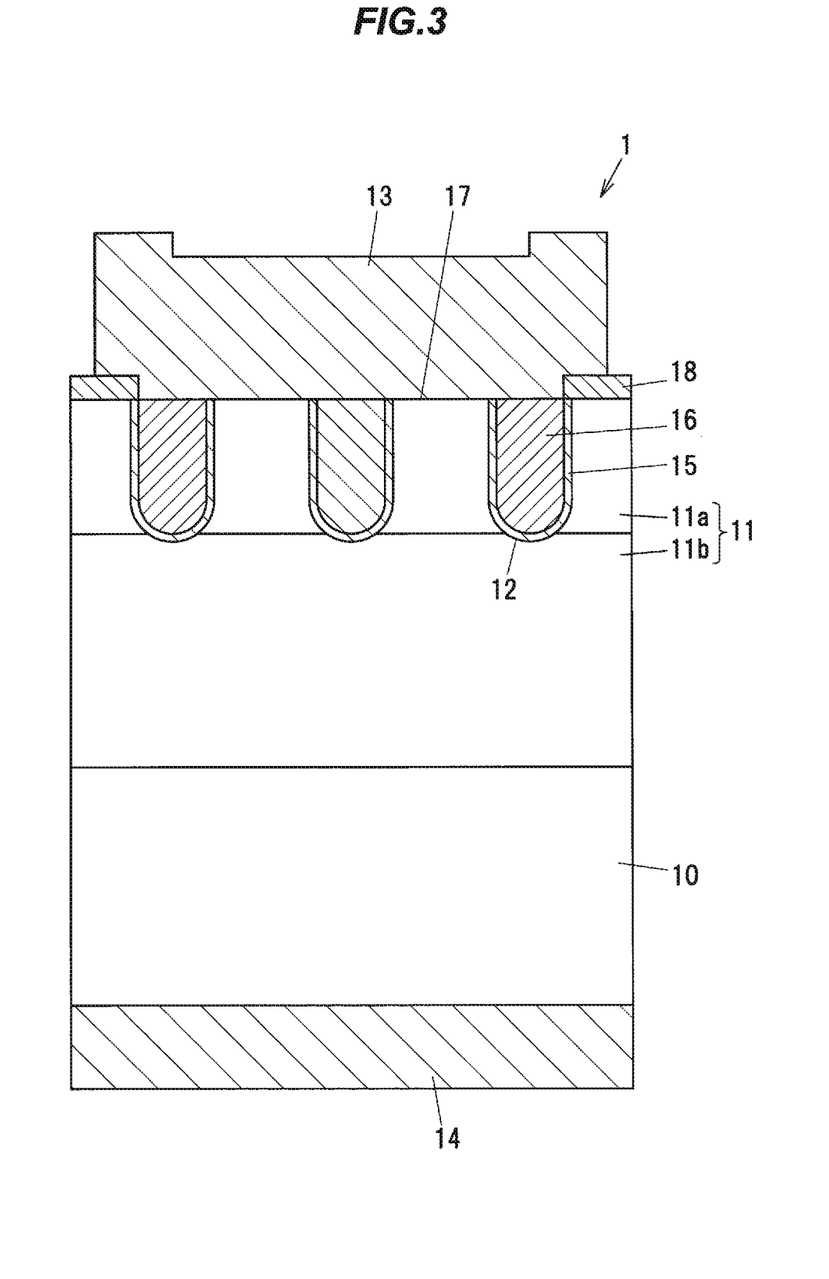
FIG. 3 is a vertical cross-sectional view showing a modification of the trench MOS Schottky diode in the first embodiment.

FIG. 3 is a vertical cross-sectional view showing a modification of the trench MOS Schottky diode 1 in the first embodiment. The trench MOS Schottky diode 1 may have a field-plate structure as shown in FIG. 3.

In the modification shown in FIG. 3, a dielectric film 18 formed of $SiO_2$, etc., is provided along an edge of the surface 17 of the second semiconductor layer 11 and the anode electrode 13 is arranged so that an edge thereof rides on the dielectric film 18.

By providing such field-plate structure, it is possible to prevent the electric field from concentrating at an edge portion of the anode electrode 13. The dielectric film 18 also serves as a passivation film for preventing a surface leakage current which flows along the surface 17 of the second semiconductor layer 11. Having or not having the field-plate structure does not affect the optimal values of various parameters (the width $W_m$ of the mesa-shaped portion, the depth $D_t$ of the trench 12, the thickness $T_i$ of the insulating film 15, etc.) of the structure of the trench MOS Schottky diode 1.

Second Embodiment

The second embodiment is different from the first embodiment in that an insulation different from the insulation constituting the insulating film 15 is buried at the bottom of each trench. The explanation of the same features as those in the first embodiment will be omitted or simplified.

(Configuration of the Trench MOS Schottky Diode)

Figure 4:
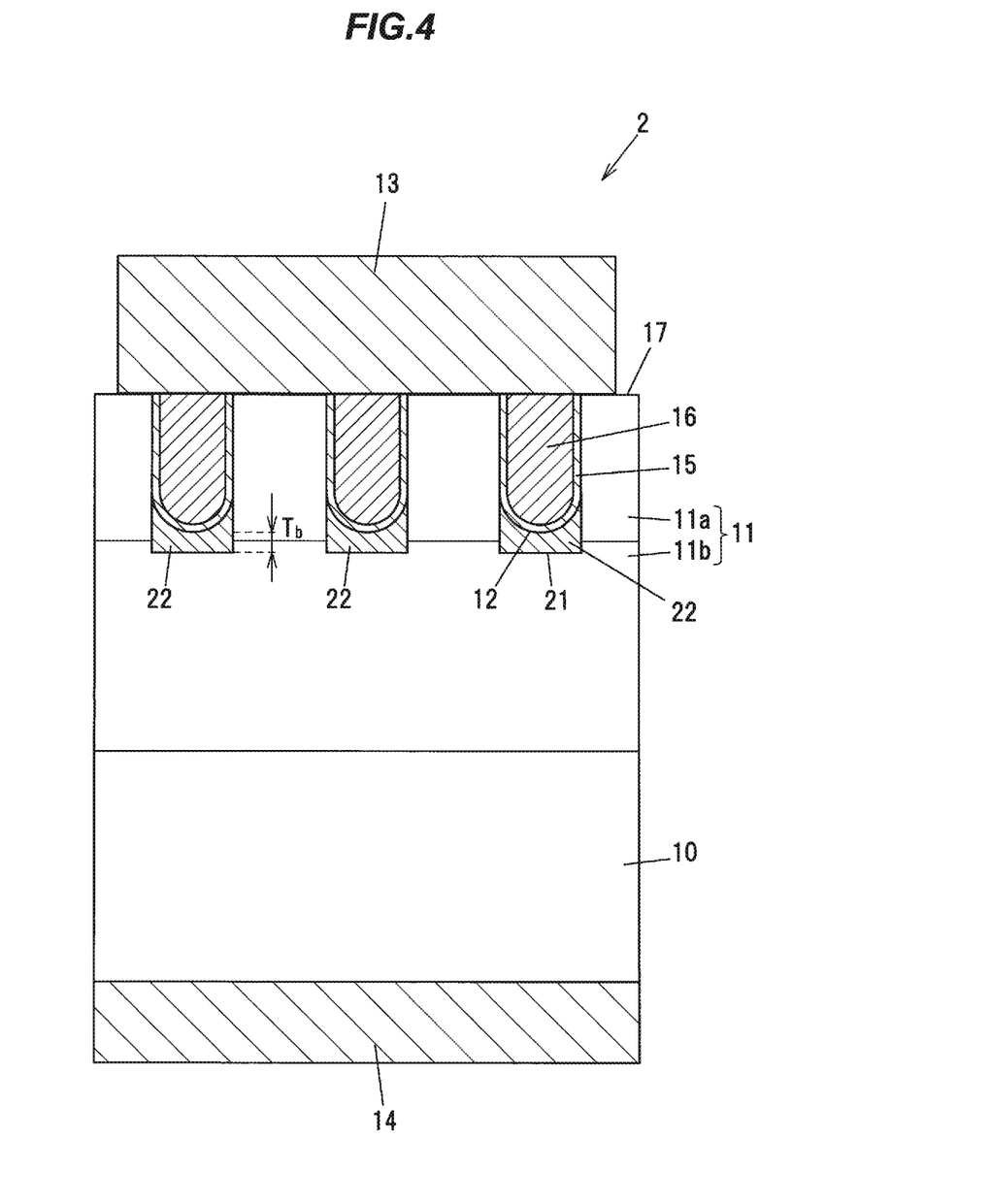
FIG. 4 is a vertical cross-sectional view showing a trench MOS Schottky diode in the second embodiment.

FIG. 4 is a vertical cross-sectional view showing a trench MOS Schottky diode 2 in the second embodiment.

The second semiconductor layer 11 of the trench MOS Schottky diode 2 has trenches 21 opened on the surface 17. An insulation 22 is buried at the bottom of each trench 21 and the insulating film 15 covers the upper surface of the insulation 22 and the inner side surface of the trench 21. The trench MOS gate 16 is buried in each trench 21 so as to be covered with the insulating film 15.

For example, after burying the insulation 22 at the bottom of the trench 21, an upper portion of the insulation 22 is roundly removed by etching to form the trench 12. Then, the insulating film 15 and the trench MOS gate 16 are formed in the trench 12. The bottom surface of the trench 21 may be flat or may be rounded in the same manner as the trench 12.

The insulation 22 is formed of an insulating material with a lower permittivity than the insulating film 15. Therefore, when voltage is applied between the anode electrode 13 and the cathode electrode 14, an electric field applied to the insulation 22 is larger than that applied to the insulating film 15.

In the trench MOS Schottky diode 1 of the first embodiment, the insulating film 15 has the highest electrical field strength in a region close to the bottom of the trench 12. Meanwhile, the second semiconductor layer 11 has the highest electrical field strength in a region immediately under the trench 12.

By providing the insulation 22 of the second embodiment, it is possible to reduce the electrical field strength in a region of the insulating film 15 close to the bottom of the trench 12 and the electrical field strength in a region of the second semiconductor layer 11 immediately under the trench 12. In other words, it is possible to reduce the maximum electric field strength in the insulating film 15 and the maximum electric field strength in the second semiconductor layer 11.

The insulation 22 is preferably formed of a material with a low permittivity such as $SiO_2$ (relative permittivity of about 4). A thickness $T_b$ of the insulation 22 immediately under the lowest portion of the insulating film 15 is preferably not less than about 200 nm. The insulation 22 has the same planar pattern as the trench 12 and typically has a width substantially equal to the width $W_t$ of the trench 12.

In the trench MOS Schottky diode 2, an increase in the electric field strength in the vicinity of the Schottky interface caused by increasing the donor concentration in the upper layer 11a can be effectively suppressed when the height of the interface between the upper layer 11a and the lower layer 11b is not less than the height of the bottom of the trench 21. Furthermore, when the height of the interface between the upper layer 11a and the lower layer 11b is not less than the height of the lowest part of the trench MOS gate 16, an increase in the electric field strength in the vicinity of the Schottky interface can be suppressed more effectively.

Effects of the Embodiments

According to the first and second embodiments, it is possible to provide a trench MOS Schottky diode having a high breakdown voltage and a low loss by dividing a semiconductor layer formed of $Ga_2O_3$ and having trenches into an upper layer and a lower layer and adjusting the donor concentration in the upper layer to be higher than the donor concentration in the lower layer.

EXAMPLES

The effect of dividing the second semiconductor layer 11 into the upper layer 11a and the lower layer 11b in the structure of the trench MOS Schottky diode 1 in the first embodiment was examined by simulations below.

The evaluation results when the trench MOS Schottky diode 1 is set to have breakdown voltages of 1200V and 600V are described below as an example.

(When it is Set to have a Breakdown Voltage of 1200V)

When the trench MOS Schottky diode 1 is configured to have a breakdown voltage of 1200V and the barrier height of the Schottky junction formed between the second semiconductor layer 11 and the anode electrode 13 is 0.7 eV, the electrical field strength immediately under the anode electrode 13 need to be not more than 0.4 MV/cm to suppress leakage current.

To meet such a condition, the width $W_m$ of the mesa-shaped portion of the second semiconductor layer 11 formed between adjacent trenches 12 is set based on the donor concentration in the upper layer 11a of the second semiconductor layer 11. For example, the width $W_m$ is set to not more than 1.4 μm when the donor concentration in the upper layer 11a is $4.5 \times 10^{16}$ cm$^{-3}$, the width $W_m$ is set to not more than 1.0 μm when the donor concentration in the upper layer 11a is $6.0 \times 10^{16}$ cm$^{-3}$, the width $W_m$ is set to not more than 0.7 μm when the donor concentration in the upper layer 11a is $9.0 \times 10^{16}$ cm$^{-3}$, and the width $W_m$ is set to not more than 0.5 μm when the donor concentration in the upper layer 11a is $1.2 \times 10^{17}$ cm$^{-3}$.

The donor concentration and thickness of the lower layer 11b of the second semiconductor layer 11 in this case are respectively set to, e.g., $3 \times 10^{16}$ cm$^{-3}$ and 4.0 μm.

Figure 5:
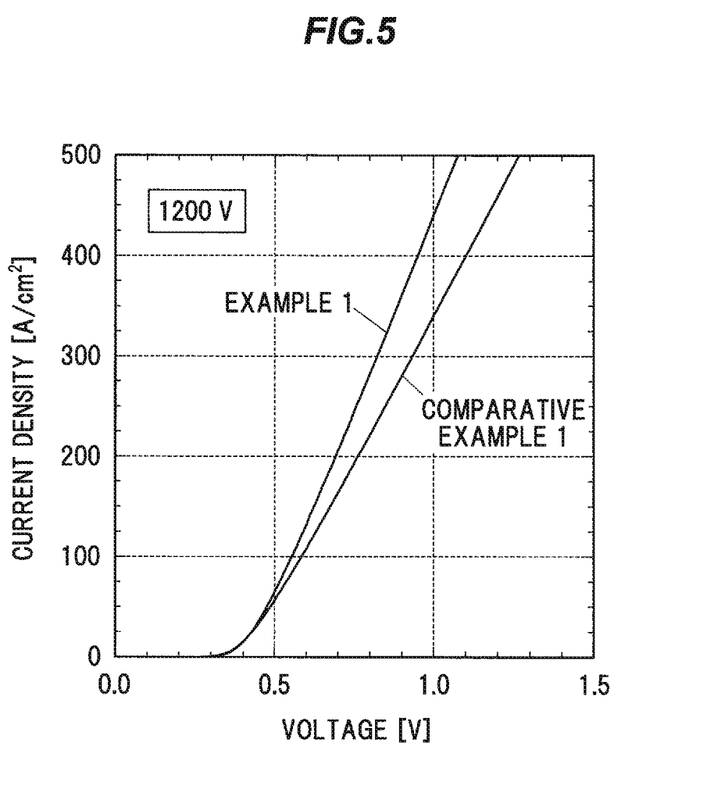
FIG. 5 is a graph showing forward characteristics of a trench MOS Schottky diode having the second semiconductor layer with a two-layer structure (breakdown voltage of 1200V) and of a trench MOS Schottky diode as Comparative Example having a single semiconductor layer instead of the second semiconductor layer (breakdown voltage of 1200V).

FIG. 5 is a graph showing forward characteristics of the trench MOS Schottky diode 1 having the second semiconductor layer 11 with a two-layer structure (hereinafter, referred to as Example 1) and of a trench MOS Schottky diode as Comparative Example having a single semiconductor layer instead of the second semiconductor layer 11 (hereinafter, referred to as Comparative Example 1).

In Example 1, the upper layer 11a had a donor concentration of $6.0 \times 10^{16}$ cm$^{-3}$ and a thickness of 3 μm, the lower layer 11b had a donor concentration of $3.0 \times 10^{16}$ cm$^{-3}$ and a thickness of 4 μm, the width $W_t$ of the trench 12 was 0.5 μm, and the width $W_m$ of the mesa-shaped portion of the second semiconductor layer 11 was 1 μm. Meanwhile, in Comparative Example 1, the single semiconductor layer used instead of the second semiconductor layer 11 had a donor concentration of $3.0 \times 10^{16}$ cm$^{-3}$ and a thickness of 7 μm, the width $W_t$ of the trench 12 was 1.0 μm, and the width $W_m$ of the mesa-shaped portion of the second semiconductor layer 11 was 2 μm. In both Example 1 and Comparative Example 1, the barrier height of the Schottky junction was 0.7 eV, the depth $D_t$ of the trench 12 was 3 μm, and the insulating film 15 was a HfO$_2$ film having a thickness of 50 nm.

FIG. 5 shows that ON resistance is smaller in Example 1 than in Comparative Example 1. This confirms that ON resistance is reduced by dividing the second semiconductor layer 11 into the upper layer 11a and the lower layer 11b and adjusting the donor concentration in the upper layer 11a to be higher than the donor concentration in the lower layer 11b.

(When it is Set to have a Breakdown Voltage of 600V)

When the trench MOS Schottky diode 1 is configured to have a breakdown voltage of 600V and the barrier height of the Schottky junction formed between the second semiconductor layer 11 and the anode electrode 13 is 0.7 eV, the electrical field strength immediately under the anode electrode 13 need to be not more than 0.4 MV/cm in the same manner as when designed to have a breakdown voltage of 1200V.

To meet such a condition, the width $W_m$ of the mesa-shaped portion of the second semiconductor layer 11 formed between adjacent trenches 12 is set based on the donor concentration in the upper layer 11a of the second semiconductor layer 11. For example, the width $W_m$ is set to not more than 1.4 μm when the donor concentration in the upper layer 11a is $9.0 \times 10^{16}$ cm$^{-3}$, the width $W_m$ is set to not more than 1.0 μm when the donor concentration in the upper layer 11a is $1.2 \times 10^{17}$ cm$^{-3}$, the width $W_m$ is set to not more than 0.67 μm when the donor concentration in the upper layer 11a is $1.89 \times 10^{17}$ cm$^{-3}$, and the width $W_m$ is set to not more than 0.5 μm when the donor concentration in the upper layer 11a is $2.4 \times 10^{17}$ cm$^{-3}$.

The donor concentration and thickness of the lower layer 11b of the second semiconductor layer 11 in this case are respectively set to, e.g., $3 \times 10^{16}$ cm$^{-3}$ and 1.5 μm.

Figure 6:
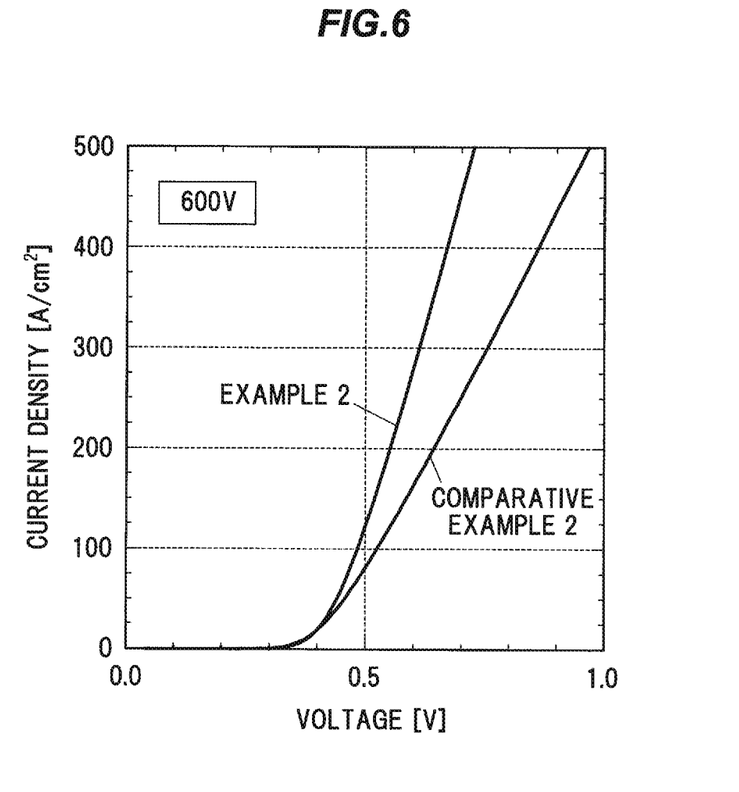
FIG. 6 is a graph showing forward characteristics of a trench MOS Schottky diode having the second semiconductor layer with a two-layer structure (breakdown voltage of 600V) and of a trench MOS Schottky diode as Comparative Example having a single semiconductor layer instead of the second semiconductor layer (breakdown voltage of 600V).

FIG. 6 is a graph showing forward characteristics of the trench MOS Schottky diode 1 having the second semiconductor layer 11 with a two-layer structure (hereinafter, referred to as Example 2) and of a trench MOS Schottky diode as Comparative Example having a single semiconductor layer instead of the second semiconductor layer 11 (hereinafter, referred to as Comparative Example 2).

In Example 2, the upper layer 11a had a donor concentration of $1.2 \times 10^{17}$ cm$^{-3}$ and a thickness of 3 μm, the lower layer 11b had a donor concentration of $3.0 \times 10^{16}$ cm$^{-1}$ and a thickness of 1.5 μm, the width $W_t$ of the trench 12 was 0.5 μm, and the width $W_m$ of the mesa-shaped portion of the second semiconductor layer 11 was 1 μm. Meanwhile, in Comparative Example 2, the single semiconductor layer used instead of the second semiconductor layer 11 had a donor concentration of $3.0 \times 10^{16}$ cm$^{-3}$ and a thickness of 4.5 μm, the width $W_t$ of the trench 12 was 1.0 μm, and the width $W_m$ of the mesa-shaped portion of the second semiconductor layer 11 was 2 μm. In both Example 2 and Comparative Example 2, the barrier height of the Schottky junction was 0.7 eV, the depth $D_t$ of the trench 12 was 3 μm, and the insulating film 15 was a HfO$_2$ film having a thickness of 50 nm.

FIG. 6 shows that ON resistance is smaller in Example 2 than in Comparative Example 2. This confirms that ON resistance is reduced by dividing the second semiconductor layer 11 into the upper layer 11a and the lower layer 11b and adjusting the donor concentration in the upper layer 11a to be higher than the donor concentration in the lower layer 11b.

Although the embodiments and Examples of the invention have been described, the invention is not intended to be limited to the embodiments and Examples, and the various kinds of modifications can be implemented without departing from the gist of the invention.

In addition, the invention according to claims is not to be limited to the embodiments and Examples described above. Further, it should be noted that all combinations of the features described in the embodiments and Examples are not necessary to solve the problem of the invention.

INDUSTRIAL APPLICABILITY

A trench MOS Schottky diode is provided which has a high breakdown voltage and a low loss.

REFERENCE SIGNS LIST 1, 2 TRENCH MOS SCHOTTKY DIODE
10 FIRST SEMICONDUCTOR LAYER
11 SECOND SEMICONDUCTOR LAYER
11a UPPER LAYER
11b LOWER LAYER
12, 21 TRENCH
13 ANODE ELECTRODE
14 CATHODE ELECTRODE
15 INSULATING FILM
16 TRENCH MOS GATE
22 INSULATION

The invention claimed is:

1. A trench MOS Schottky diode, comprising:
a first semiconductor layer comprising a $Ga_2O_3$-based single crystal;
a second semiconductor layer that is a layer laminated on the first semiconductor layer and that comprises a $Ga_2O_3$-based single crystal and a trench opened on a surface thereof opposite to the first semiconductor layer;
an anode electrode formed on the surface of the second semiconductor layer opposite to the first semiconductor layer;
a cathode electrode formed on a surface of the first semiconductor layer opposite to the second semiconductor layer;
an insulating film covering an inner surface of the trench of the second semiconductor layer; and
a trench MOS gate that is buried in the trench of the second semiconductor layer so as to be covered with the insulating film and is in contact with the anode electrode,
wherein the second semiconductor layer comprises a lower layer on a side of the first semiconductor layer and an upper layer on a side of the anode electrode having a higher donor concentration than the lower layer.

2. The trench MOS Schottky diode according to claim 1, wherein a height of an interface between the upper layer and the lower layer is not less than a height of a bottom of the trench.

3. The trench MOS Schottky diode according to claim 2, wherein the height of the interface between the upper layer and the lower layer is not less than a height of a lowest part of the trench MOS gate.

4. The trench MOS Schottky diode according to claim 1, wherein a donor concentration of the first semiconductor layer is higher than a donor concentration of the upper layer of the second semiconductor layer.

5. The trench MOS Schottky diode according to claim 1, comprising a plurality of the trenches,
wherein each mesa-shaped portion of the second semiconductor layer between adjacent trenches has a width according to the donor concentration of the upper layer of the second semiconductor layer.

6. The trench MOS Schottky diode according to claim 1, wherein a lower surface of the insulating film is covered with an insulation having a lower permittivity than the insulating film.

7. The trench MOS Schottky diode according to claim 2, wherein a donor concentration of the first semiconductor layer is higher than a donor concentration of the upper layer of the second semiconductor layer.

8. The trench MOS Schottky diode according to claim 3, wherein a donor concentration of the first semiconductor layer is higher than a donor concentration of the upper layer of the second semiconductor layer.

9. The trench MOS Schottky diode according to claim 2, comprising a plurality of the trenches,
wherein each mesa-shaped portion of the second semiconductor layer between adjacent trenches has a width according to the donor concentration of the upper layer of the second semiconductor layer.

10. The trench MOS Schottky diode according to claim 3, comprising a plurality of the trenches,
wherein each mesa-shaped portion of the second semiconductor layer between adjacent trenches has a width according to the donor concentration of the upper layer of the second semiconductor layer.

11. The trench MOS Schottky diode according to claim 2, wherein a lower surface of the insulating film is covered with an insulation having a lower permittivity than the insulating film.

12. The trench MOS Schottky diode according to claim 3, wherein a lower surface of the insulating film is covered with an insulation having a lower permittivity than the insulating film.

* * * * *